United States Patent [19]

Kammiller

[11] Patent Number: 4,750,076
[45] Date of Patent: Jun. 7, 1988

[54] GEOMETRIC ARRANGEMENT FOR FILTER CAPACITORS

[75] Inventor: Neil Kammiller, Lakewood, Ohio

[73] Assignee: Reliance Comm/Tec Corporation, Chicago, Ill.

[21] Appl. No.: 40,224

[22] Filed: Apr. 20, 1987

[51] Int. Cl.[4] ............................................. H02H 7/16
[52] U.S. Cl. ........................................ 361/15; 361/16; 361/17; 357/45; 357/68
[58] Field of Search ..................... 361/15–17; 357/45, 68

[56] References Cited

U.S. PATENT DOCUMENTS 3,628,091 12/1971 Wolf ........................................ 361/15
4,219,856 8/1980 Danfors et al. ........................ 361/15
4,529,999 7/1985 Bender et al. ........................ 357/68
4,584,595 4/1986 Kammiller ............................ 357/41
4,648,017 3/1987 Nerone .................................. 363/28

Primary Examiner—A. D. Pellinen
Assistant Examiner—Jeffrey A. Gaffin
Attorney, Agent, or Firm—Michael M. Rickin

[57] ABSTRACT

A geometric arrangement for filter capacitors used in high frequency power supplies such that a multiplicity of paralleled capacitors not only share the current but also provide optimum filtering. The terminals of each of the capacitors are connected by equal inductances to receive the rectified alternating current. The capacitor terminals are also connected directly to the output of the supply in order to provide the D.C. current thereto.

15 Claims, 6 Drawing Sheets

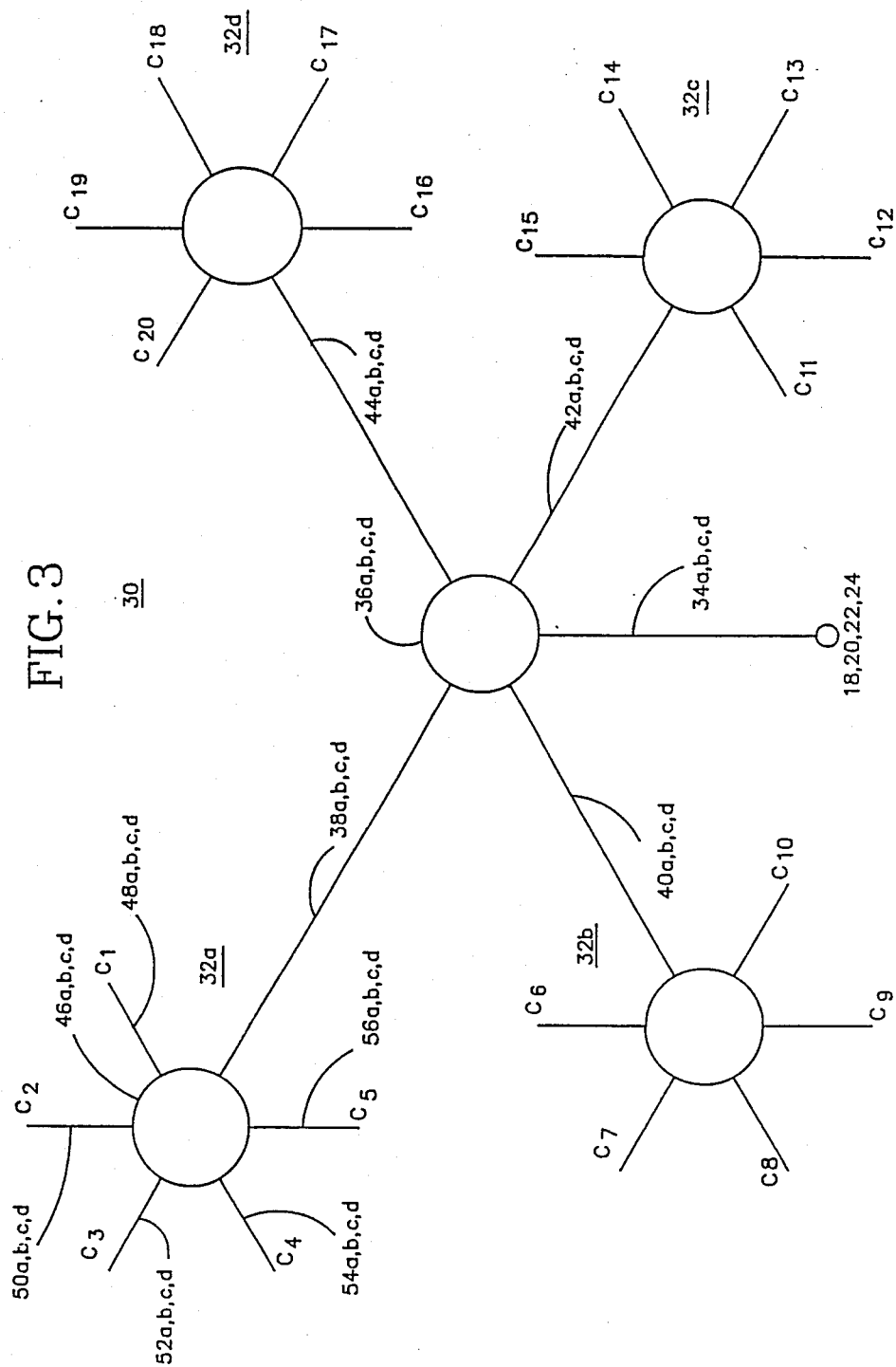

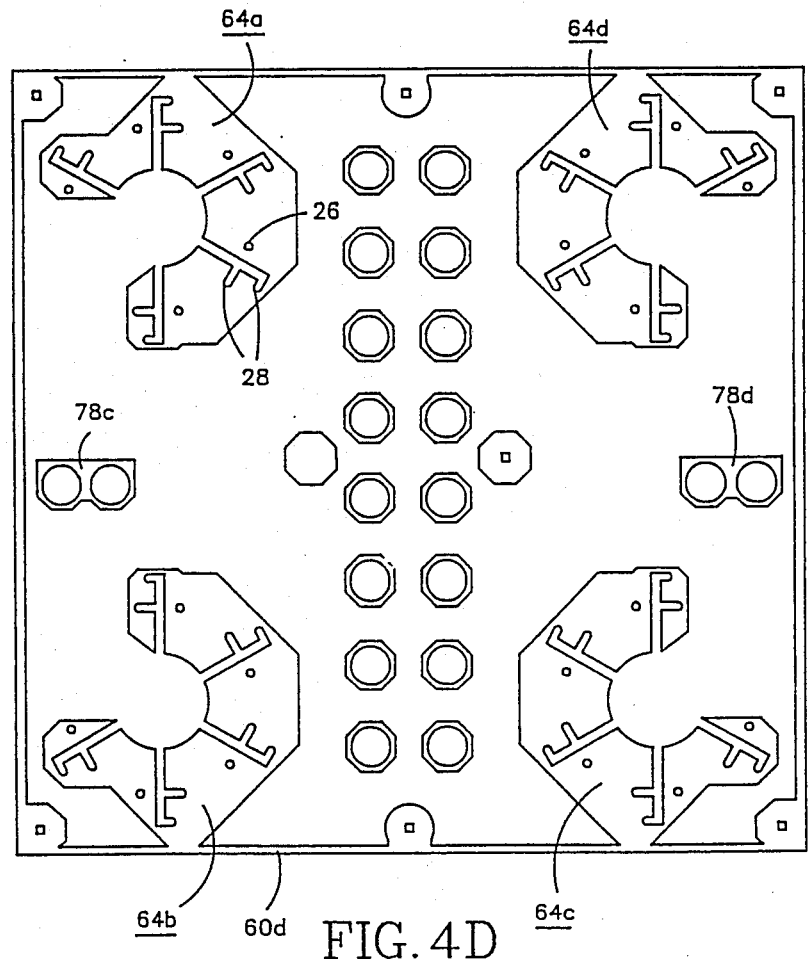

GEOMETRIC ARRANGEMENT FOR FILTER CAPACITORS

BACKGROUND OF THE INVENTION

1. Field of the Invention

This invention relates to filter capacitors used in power supplies and more particularly to an arrangement of such capacitors for use in high frequency power supplies.

2. Description of the Prior Art

It is well known to provide power conversion at higher power supply operating frequencies and efficiencies. One example of providing such power conversion is by using a series resonant power supply of the type shown in U.S. Pat. No. 4,648,017. The power supply shown therein uses capacitors arranged on the secondary side of the power transformer for purposes of filtering the voltage in order to provide the desired D.C. output voltage.

In the series resonant power supply the A.C. output current is higher in amplitude than the D.C. output current. Those supplies which are designed to provide relatively high amplitude D.C. output currents, e.g., 200 amperes, require a substantial amount of capacitance and ripple current capability in the output filter. To obtain that capacitance and ripple current capability a multiplicity of capacitors must be connected in parallel. The capacitors must be geometrically arranged to share the output current of the supply.

One solution to the most desirable geometric arrangement for the filter capacitors in order to accomplish current sharing is suggested in my U.S. Pat. No. 4,584,595 (hereinafter the '595 patent). While the radial arrangement shown therein may provide the desired current sharing, I have found that it does not provide optimum filtering. Not only must the output capacitors share the current, they must also function to optimally filter that current.

SUMMARY OF THE INVENTION

A geometric arrangement for filter capacitors. A group of N capacitors (where N is greater than one) has its first and second terminals connected to first and second connection points, respectively. The terminals are connected to the connection points in a manner such that the terminals are electrically equidistant from the associated ones of the connection points and equal inductances are provided in each of the electrical connections. The terminals are directly electrically connected to third and fourth connection points in a manner such that they are electrically equidistant from the associated ones of those connection points.

DESCRIPTION OF THE DRAWING

FIG. 3 is a representational connection diagram which shows the geometric arrangement for the 20 capacitors.

FIGS. 4A to 4D are the actual tracings from a four layer printed circuit board for arranging the capacitors in accordance with the present invention.

DESCRIPTION OF THE PREFERRED EMBODIMENT

Figure 1:
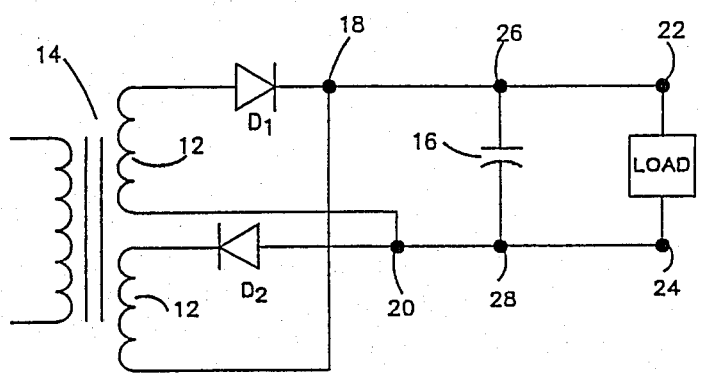
FIG. 1 is a schematic diagram showing that part of a series resonant power supply which is connected to the secondary winding of the power transformer.

Referring to FIG. 1 there is shown that part of the typical series resonant power supply which is connected to the secondary winding 12 of power transformer 14. The output filter capacitor 16 is connected between connection points 18 and 20 from diodes D1 and D2 and connection points 22 and 24 which are the output of the supply. As will be described in more detail hereinafter, capacitor 16 is the combination of N capacitors connected in parallel between connection points 18, 20 and 22, 24. The N capacitors are connected in parallel so that they can provide the relatively large capacitance needed in the output filter. For example, in a series resonant power supply designed to provide a full load D.C. output current of 200 amperes it is necessary for the capacitance of the output filter to be in the order of 32,000 microfarads and the ripple current capability to be in the order of 240 amperes rms. As is well known the current at connection points 18 and 20 is a rectified A.C. current. Such a large capacitance and ripple current capability can be provided by connecting 20 capacitors, i.e., N=20, having the same capacitance in parallel in the manner described below.

Figure 2:
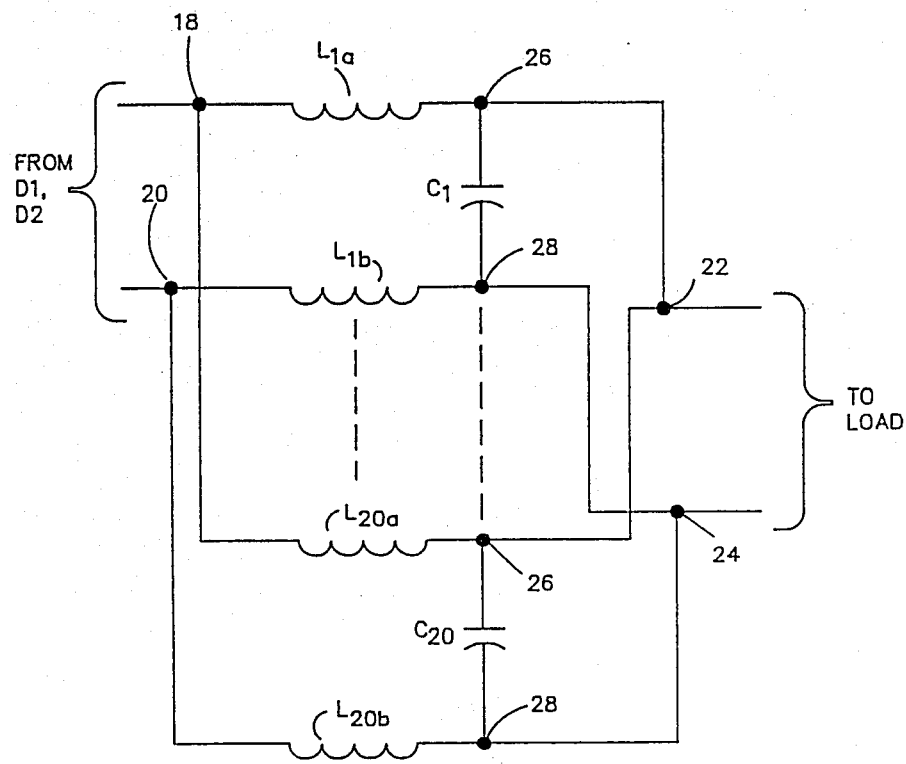
FIG. 2 is a schematic diagram showing the parallel arrangement of 20 capacitors in accordance with the present invention.

Referring to FIG. 2 there is shown in schematic form the parallel arrangement of the 20 output filter capacitors described above which allows for sharing by the filter capacitors of the current and in particular the ripple current from diodes D1 and D2 of FIG. 1 as well as optimum filtering. The terminals 26, 28 of paralleled capacitors C1 to C20 are each individually connected to connection points 18 and 20, i.e., to the outputs of diodes D1 and D2, by associated pairs of matching inductors (L1a and L1b for capacitor C1 to L20a and L20b for capacitor C20). The terminals 26, 28 of capacitors C1 to C20 are also directly connected to connection points 22 and 24, i.e., to the output of the supply. I have found that the connection of the terminals of capacitors C1 to C20 to connection points 18, 20 and 22, 24 in the above manner allows the capacitors to not only share the current, but also to provide optimum filtering.

Referring to FIG. 3 there is shown in the form of a representational connection diagram a geometrical arrangement 30 by which the terminals 26, 28 of each of the 20 capacitors C1 to C20 can be connected in parallel. For ease of illustration the inductors L1a and L1b to L20a and L20b have been omitted. The 20 capacitors may be arranged in four groups, 32a, 32b, 32c and 32d, of five capacitors each. In accordance with the '595 patent, and in particular as shown in FIG. 4 therein, the same terminal of each of the 20 capacitors should all be electrically equidistant from the associated connection point 18, 20, 22, 24. It is that arrangement which allows the 20 capacitors to equally share the current and in particular the ripple current from diodes D1 and D2. The diagram of FIG. 3 represents the connection of the same terminal in all 20 capacitors to the corresponding connection point. The particular capacitor terminal which is represented in FIG. 3 is not of importance, it is rather the manner in which that terminal is connected to the connection point.

In arrangement 30, also known as a cluster, the terminal 18, 20, 22 or 24 is connected by a metallic conductor 34a, 34b, 34c, 34d, respectively to a conductor 36a, 36b, 36c, 36d, respectively having a predetermined known shape. For example, as set forth in the '595 patent, the shape may be circular (as shown in FIG. 3 for ease of illustration) or any other shape which results in achieving the desired result that the four groups of capacitors 32a, 32b, 32c, 32d, also known as pods, are all essentially electrically equidistant from the associated connection point. In turn the conductors 36a, 36b, 36c and 36d are each connected by an associated metallic conductor to the associated one of pods 32a, 32b, 32c and 32d. Conductors 38a, 38b, 38c and 38d connect conductors 36a, 36b, 36c and 36d, respectively, to pod 32a. In a similar manner conductors 40a to 40d, 42a to 42d and 44a to 44d connect conductors 36a to 36d to the associated one of pods 32b to 32d.

As all four pods are identical, only one pod, 32a, need be described in detail. Pod 32a has an essentially circular conductor 46a to 46d to which each of the terminals 26, 28 of capacitors C1 to C5 are connected by the associated ones of conductors 48a to 48d for capacitor C1, conductors 50a to 50d for capacitor C2, conductors 52a to 52d for capacitor C3, conductors 54a to 54d for capacitor C4 and conductors 56a to 56d for capacitor C5. Terminal 26 of capacitor C1 is then connected to connection point 18 by the combination of conductor 48a, conductor 46a, conductor 38a, conductor 36a and conductor 34a. Terminal 26 is also connected to connection point 22 by the combination of conductors 48c, 46c, 38c, 36c and 34c. Terminal 28 is connected to connection point 20 by the combination of conductors 48b, 46b, 38b, 36b and 34b, and to connection point 24 by the combination of conductors 48d, 46d, 38d, 36d and 34d. Similar connection combinations can be listed for capacitors C2 to C5 of pod 32a as well as for capacitors C6 to C10 of pod 32b, capacitors C11 to C15 of pod 32c and capacitors C16 to C20 of pod 32d.

Referring now to FIGS. 4A to 4D there are shown the conductor tracings for a four layer printed circuit board which allows current sharing and optimum filtering for capacitors C1 to C20 to be accomplished. Each of FIGS. 4A to 4D shows the traces on one layer 60a, 60b, 60c, 60d, respectively of the four layer board. The layers 60a, 60b are associated respectively with the connection of terminals 26, 28 of each of capacitors C1 to C20 to connection points 18, 20. The layers 60c, 60d respectively are associated with the connection of terminals 26, 28 to connection points 22, 24. For ease of illustration neither the connection points 18, 20, 22 and 24 nor the capacitors have not been shown in FIGS. 4A to 4D.

In one embodiment of the four layer board, layer 60d was the component side of the board, layers 60c, 60b, 60a were below layer 60d with layer 60c being the first layer below the component side and layer 60a being the farthest layer from the component side. As set out in more detail hereinafter, it is important to my invention that the two layers 60a, 60b having thereon the tracings for connecting terminals 26, 28 to connection points 18, 20 be on top of each other. It is also important that the layers 60c, 60d having thereon the tracings for connecting terminals 26, 28 to connection points 22 and 24 also be on top of each other.

As shown in FIGS. 4A to 4D, the capacitors C1 to C20 are arranged in a cluster 62 which has four pods 64a, 64b, 64c, 64d each having five (5) capacitors. Capacitors C1 to C5 are in pod 64a, capacitors C6 to C10 are in pod 64b, capacitors C11 to C15 are in pod 64c and capacitors C16 to C20 are in pod 64d. The pods 64a to 64d are identical and therefore in further describing FIGS. 4A to 4D it will only be necessary to describe one pod (64a) in each figure.

Figure 4A:
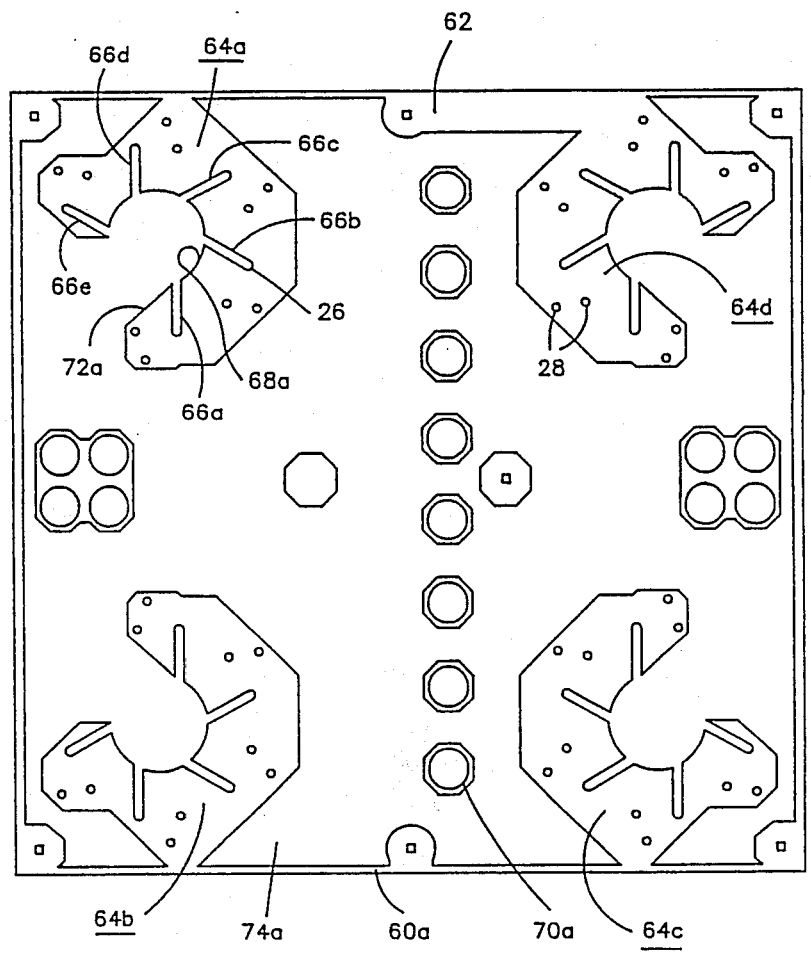

FIG. 4A shows the tracings on that layer 60a of the board by which terminal 26 of each of capacitors C1 to C20 is connected to connection point 18. Each of capacitors C1 to C5 of pod 64a have their terminal 26 connected to essentially circular conductor 68a by the associated one of conductors 66a to 66e. As set forth in my '595 patent, this arrangement allows the capacitors C1 to C5 to be essentially equidistant from conductor 68a. The rectified alternating current present at connection point 18 is brought to layer 60a by suitably sized copper conductors (not shown). These conductors appear at layer 60a in the associated ones of eight connection points which are not visible in FIG. 4A as they are part of the tracings. The eight nonvisible connection points lie in a column which is just to the left of the eight holes in column 70a. The eight copper conductors are used for carrying the current from connection point 18 to layer 60a. Those eight conductors are equivalent to conductor 34a of FIG. 3.

Essentially circular conductor 68a is connected by a conductor 72a to a conductor 74a. That conductor is in turn connected to the eight suitably sized copper conductors which carry the rectified alternating current to the layer from connection point 18. Conductor 74a is equivalent to conductor 36a of FIG. 3. While conductor 36a is shown as being essentially circular and conductor 74a clearly is not, this does not prevent the capacitors C1 to C5 (as well as capacitors C6 to C10, C11 to C15, C16 to C20) from being essentially electrically equidistant from connection point 18. The tracing shown in FIG. 4A allows the capacitors C1 to C20 to share the rectified alternating current at connection point 18 essentially equally.

Figure 4B:
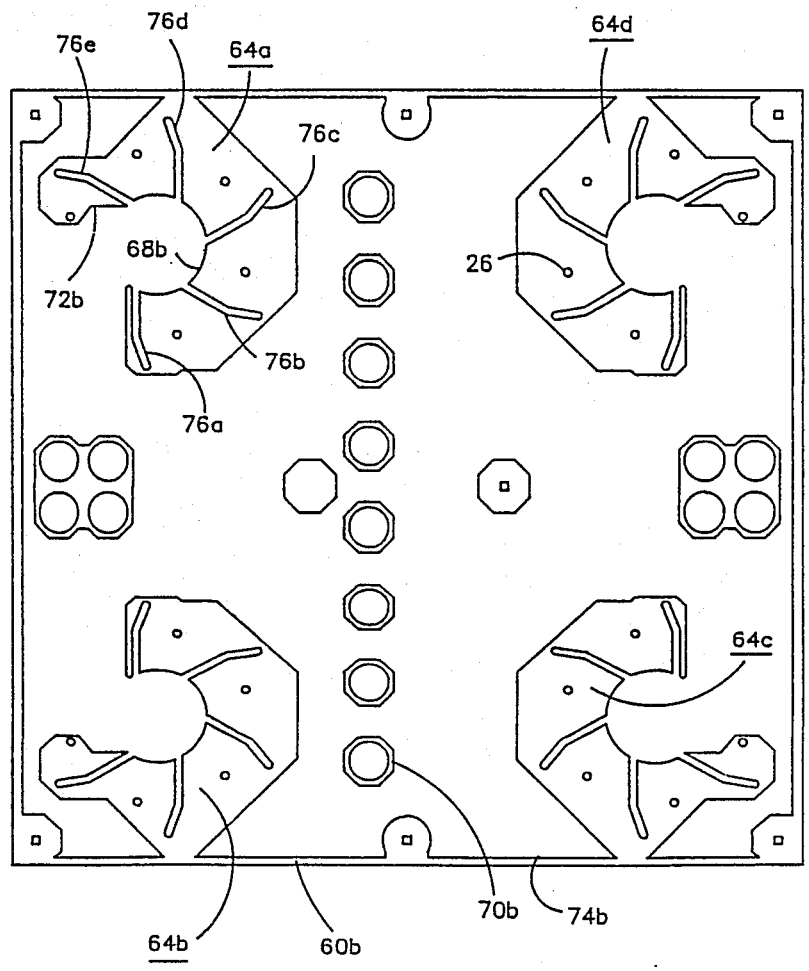

FIG. 4B shows the conductor tracings on layer 60b of the board which connect terminal 28 of each of capacitors C1 to C20 to connection point 20. The tracings on layer 60b are essentially identical to the tracings on layer 60a except that when layers 60a and 60b are placed one on top of the other part of the tracings on each layer do not overlay each other. That part of the tracings which do not overlay each other and the purpose therefor are described below.

The capacitors C1 to C5 of pod 64a of layer 60b each have their terminal 28 connected to essentially circular conductor 68b by the associated one of the conductors 76a to 76e. The conductor 68b is connected by a conductor 72b to a conductor 74b. The alternating current present at connection point 20 is brought to layer 60b by suitably sized copper conductors (not shown). Those conductors appear at layer 60b in the associated ones of eight connection points which are not visible in FIG. 4B as they are part of the tracings. The eight nonvisible connection points lie in a column which is just to the right of the eight holes in column 70b. The eight such copper conductors are used for carrying the current from connection point 20 to layer 60b. Those eight conductors are equivalent to conductor 34b of FIG. 3. It is conductor 74b which is connected to the eight suitably sized copper conductors.

When layers 60a and 60b are placed one on top of the other it is conductors 66a to 66e of layer 60a which do not overlay conductors 76a to 76e of layer 60b. As described in connection with FIG. 2, in order for capacitors C1 to C20 to not only share the rectified alternating current but also provide optimum filtering I have found that terminals 26, 28 of each of the capacitors must be connected to connection points 18, 20 by the inductors L1a, L1b to L20a, L20b all of which have equal inductance. Such inductors might be provided by inserting physical inductors in the connecting paths. They may also be provided by the traces themselves. For the embodiment being described herein the needed inductances which are each in the order of 0.1 to 0.2 microhenries was provided by the traces themselves.

Specifically it is trace conductors 66a to 66e and 76a to 76e that provide that equal inductance. As those traces do not overlay each other, i.e., trace conductor 66a on layer 60a does not overlay trace conductor 76a on layer 60b, etc., the equal inductance provided by each of those conductors is not coupled to each other. Such coupling would substantially reduce any inductance provided by those conductors. Therefore, the inductors needed to provide equal inductance so that both current sharing and optimum filtering is accomplished between terminals 26, 28 of each of capacitors C1 to C20 and connecting points 18, 20 by the conductor tracings themselves on layers 60a, 60b.

Figure 4C:
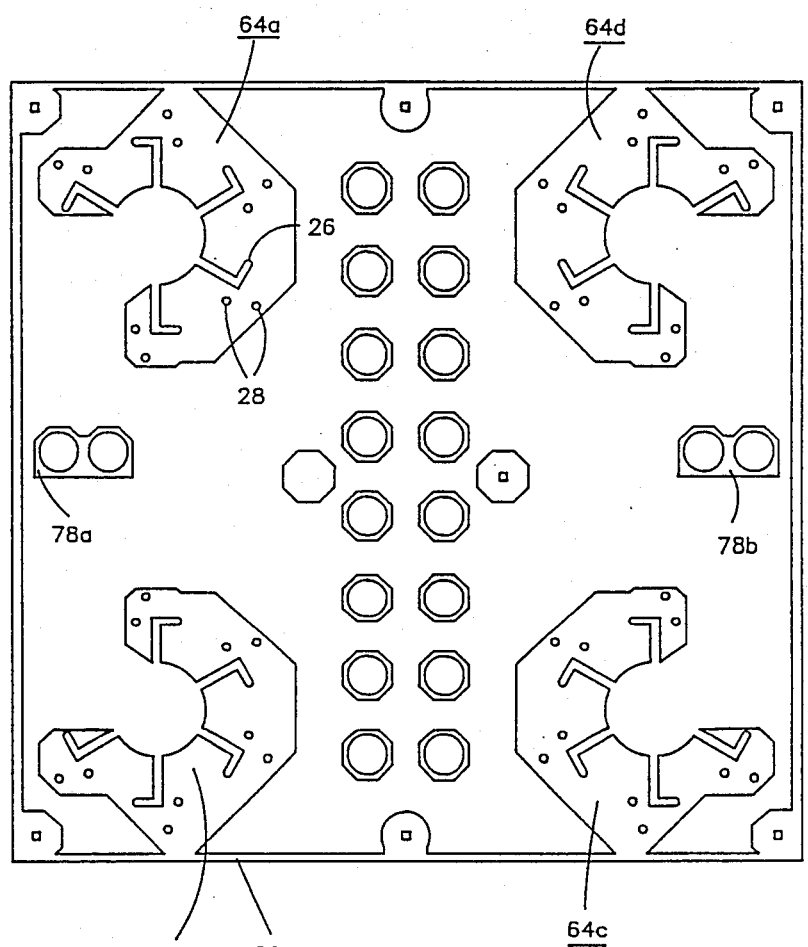

FIGS. 4C and 4D, respectively show the conductor tracings on layers 60c and 60d. The tracings on layer 60c connect terminal 26 of each of capacitors C1 to C20 to connection point 22. The tracings on layer 60d connect terminal 28 of each of capacitors C1 to C20 to connection point 24. The tracings on layers 60c and 60d are essentially identical to the tracings on layers 60a and 60b and therefore it is not necessary to describe them in detail. Only the differences between the tracings on layers 60c, 60d and those on layers 60a, 60b are described below. There are two such differences one of which is minor and the other of which is major.

The minor difference is in the location on layers 60c, 60d of the connection points by which the suitably sized copper conductors used to carry the D.C. current from capacitor terminals 26, 28 to connection points 22, 24 enter those layers. As on layers 60a, 60b those connection points are not visible as they are part of the tracings. On layer 60c there are two groups of two connection points each. One group is located directly below the two holes 78a and the other group is located directly below the two holes 78b. On layer 60d there are also two groups of two connection points each. One group is located directly above the two holes 78c and the other group is located directly above the two holes 78d.

The major difference is that when layers 60c and 60d are placed on top of each other the tracings on one layer are required to and do fully overlay the same tracings on the other layer. As described previously in connection with FIG. 2, I have found that terminals 26, 28 of each of the capacitors must be directly connected to connection points 22, 24 without any inductors in the connection path. The current flowing between terminals 26, 28 and connection points 22, 24 is D.C., i.e., it is the current which results from the filtering provided by the capacitors to the rectified A.C. current present at connection points 18, 20. The D.C. current flowing in the various traces is shared due to the balanced geometry of the traces. It is also desirable to cancel any currents which are induced in the connection paths between terminals 26, 28 and connection points 22, 24, i.e., the connection paths should have the same ability to cancel induced signals as do twisted pairs of wires.

All of the above is obtained by minimizing the inductance in each connection path. It is the full overlaying of the traces on layers 60c and 60d which accomplishes that minimization. Thus, optimum filtering is provided by the combination of the inductance in layers 60a and 60b and the full overlaying of the traces in layers 60c and 60d which overlaying allows for those layers to reject the magnetic fields generated by the trace inductances in layers 60a and 60b.

In summary it should be appreciated that:

(i) the capacitor terminals 26, 28 are the only common point among the traces, i.e., the only common point between the traces for the same capacitor on layers 60a, 60c is terminal 26 and on layers 60b, 60d is terminal 28;

(ii) while the needed equal inductances have been provided in the embodiment described herein by the traces themselves that such inductances could have been provided by the use of only physical inductors or a combination of physical inductors and traces;

(iii) the full overlaying of the traces on layers 60c and 60d essentially eliminates the sensitivity to flux sprayed from traces on layers 60A and 60B.

(iv) while four groups of five capacitors each have been shown in FIGS. 3 and 4A to 4D that my present invention allows any number of capacitors greater than one to share current and provide optimum filtering and that a relatively small number of capacitors, can be arranged as shown in FIG. 3 of my '595 patent, e.g., if there were only capacitors C1 to C5 then current sharing could be obtained by having the end of conductor 38a, b, c, d shown herein in FIG. 3 as connected to conductor 36a, b, c, d connected directly to connection points 18, 20, 22, 24.

It is to be understood that the description of the preferred embodiment is intended to be only illustrative, rather than exhaustive, of the present invention. Those of ordinary skill will be able to make certain additions, deletions, and/or modifications to the embodiment of the disclosed subject matter without departing from the spirit of the invention or its scope, as defined by the appended claims.

What is claimed is:

1. A circuit arrangement for capacitors comprising:
   (a) a first group of N capacitors wherein N is greater than one, each of said N capacitors having first and second terminals;
   (b) first and second connection points;
   (c) third and fourth connection points;
   (d) first means for electrically connecting said first and said second terminals of each of said N capacitors to said first and said second connection points, respectively, such that all of said first and said second terminals are electrically equidistant from said first and said second connection points, said first means providing an inductor in each of said first means electrical connections, said first means electrical connections being physically arranged so that each of said inductors have essentially the same predetermined inductance and said electrical connections are not coupled to each other; and
   (e) second means for electrically connecting said first and said second terminals of each of said N capacitors to said third and said fourth connection points, respectively, such that all of said first and said second terminals are electrically equidistant from said third and said fourth connection points, said second means providing an inductor in each of said second means electrical connections, said second means electrical connections being physically arranged so that said second means electrical connections for said first and said second terminals of each of said N capacitors are coupled to each other to thereby minimize the inductive effect in said inductors.

2. The circuit arrangement of claim 1 further comprising:
(a) a second group of M capacitors wherein M is greater than one, each of said second group M capacitors having said first and said second terminals;
(b) third means for electrically connecting said first and said second terminals of each of said second group M capacitors to said first and said second connection points, respectively, such that all of said first and said second terminals are electrically equidistant from said first and said second connection points, said third means providing an inductor in each of said third means electrical connections, said third means electrical connections being physically arranged so that each of said inductors have essentially the same predetermined inductance as said predetermined inductance of said first means provided inductors and said electrical connections are not coupled to each other; and
(c) fourth means for electrically connecting said first and said second terminals of each of said second group M capacitors to said third and said fourth connection points, respectively, such that all of said first and said second terminals are electrically equidistant from said third and said fourth connection points, said fourth means providing an inductor in each of said fourth means electrical connections, said fourth means electrical connections being physically arranged so that said fourth means electrical connections for said first and said second terminals of each of said second group M capacitors are coupled to each other to thereby minimize the inductive effect of said inductors.

3. The circuit arrangement of claim 2 wherein M is equal to N.

4. The circuit arrangement of claim 1 further comprising:
(a) M groups of N capacitors each wherein M is one or greater and N is greater than one, each of said M times N capacitors having said first and said second terminals;
(b) first means associated with a respective one of each of said M groups for electrically connecting said first and said second terminals of each of said N capacitors in each of said associated groups to said first and said second connection points, respectively, said first means providing an inductor in each of said first associated means electrical connections, said first associated means electrical connections being physically arranged so that each of said inductors have essentially the same predetermined inductance as said predetermined inductance of said first means provided inductors and said electrical connections are not coupled to each other; and
(c) second means associated with a respective one of each of said M groups for electrically connecting said first and said second terminals of each of said N capacitors in each of said associated groups to said third and said fourth connection points, respectively, said second associated means providing an inductor in each of said second associated means electrical connections, said second associated means electrical connections being physically arranged so that said second associated means electrical connections for said first and said second terminals of each of said N capacitors in each of said associated groups are coupled to each other to thereby minimize the inductive effect of said inductors.

5. The circuit arrangement of claim 1 wherein said first group of N capacitors are mounted on a printed circuit board having at least four layers; said first means are conductive traces on one layer of said at least four layers for electrically connecting said first terminals to said first connection points and are also conductive traces on another layer of said at least four layers for electrically connecting said second terminals to said second connection points; and said second means are conductive traces on yet another layer of said at least four layers for electrically connecting said first terminals to said third connection points and are also conductive traces on a remaining layer of said at least four layers for electrically connecting said second terminals to said fourth connection points.

6. The circuit arrangement of claim 5 wherein said printed circuit board has only four layers and said first group of N capacitors are mounted on either said one layer or said another layer of said four layers.

7. The circuit arrangement of claim 6 wherein said one layer and said another layer lie one on top of another; and said yet another layer and said remaining layer also lie one on top of another.

8. The circuit arrangement of claim 5 wherein said printed circuit board has only four layers and said first group of N capacitors are mounted either on said remaining layer or said yet another layer of said four layers.

9. The circuit arrangement of claim 8 wherein said one layer and said another layer lie one on top of another; and said yet another layer and said remaining layer also lie one on top of another.

10. A circuit arrangement for connecting two or more capacitors in parallel between two input points and two output points, each of said capacitors having first and second terminals, said arrangement comprising:
(a) first means for electrically connecting said first terminal of each of said two or more capacitors to one of said input points and for electrically connecting said second terminal of each of said two or more capacitors to the other of said input points such that all of said first and said second terminals are electrically equidistant from said first and said connection points, said first means providing in each of said electrical connections an inductor, said first means electrical connections being physically arranged so that each of said inductors have essentially the same predetermined inductance and said electrical connections for said first and said second terminals of each of said two or more capacitors are not coupled to each other; and
(b) second means for electrically connecting said first terminal of each of said two or more capacitors to one of said output points and for electrically connecting said second terminal of each of said two or more capacitors to the other of said output points such that all of said first and said second terminals are electrically equidistant from said third and said fourth connection points, said second means providing in each of said electrical connections an inductor, said second means electrical connections being physically arranged so that said second means electrical connections for said first and said second terminals of each of said two or more capacitors are coupled to each other to thereby minimize any inductive effect of said inductors.

11. The circuit arrangement of claim 10 wherein said each of said two or more capacitors are mounted on a printed circuit board having at least four layers; said first means are conductive traces on one layer of said at least four layers for electrically connecting said first terminals to said first connection points and are also conductive traces on another layer of said at least four layers for electrically connecting said second terminals to said second connection points; and said second means are conductive traces on yet another layer of said at least four layers for electrically connecting said first terminals to said third connection points and are also conductive traces on a remaining layer of said at least four layers for electrically connecting said second terminals to said fourth connection points.

12. The circuit arrangement of claim 11 wherein said printed circuit board has only four layers and each of said two or more capacitors are mounted on either said one layer or said another layer of said four layers.

13. The circuit arrangement of claim 12 wherein said one layer and said another layer lie one on top of another; and said yet another layer and said remaining layer also lie one on top of another.

14. The circuit arrangement of claim 11 wherein said printed circuit board has only four layers and each of said two or more capacitors are mounted either on said remaining layer or said yet another layer of said four layers.

15. The circuit arrangement of claim 14 wherein said one layer and said another layer lie one on top of another; and said yet another layer and said remaining layer also lie one on top of another.

* * * * *